US010121819B2

(12) United States Patent
Yao

(10) Patent No.: US 10,121,819 B2
(45) Date of Patent: Nov. 6, 2018

(54) PHOTOTRANSISTOR HAVING E-B JUNCTION AND B-C JUNCTION ARE IN DIRECT PHYSICAL CONTACT AND COMPLETELY ENCAPSULATED ONLY BY THE EMITTER, THE COLLECTOR AND A DIELECTRIC

(71) Applicant: Wavefront Holdings, LLC, Basking Ridge, NJ (US)

(72) Inventor: Jie Yao, Basking Ridge, NJ (US)

(73) Assignee: WAVEFRONT HOLDINGS, LLC, Basking Ridge, NJ (US)

( * ) Notice: Subject to any disclaimer, the term of this patent is extended or adjusted under 35 U.S.C. 154(b) by 172 days.

(21) Appl. No.: 15/372,950

(22) Filed: Dec. 8, 2016

(65) Prior Publication Data

US 2018/0233532 A1    Aug. 16, 2018

Related U.S. Application Data

(60) Provisional application No. 62/266,935, filed on Dec. 14, 2015.

(51) Int. Cl.
*H01L 27/146* (2006.01)
*H01L 31/11* (2006.01)

(52) U.S. Cl.
CPC .. *H01L 27/14681* (2013.01); *H01L 27/14603* (2013.01); *H01L 31/1105* (2013.01)

(58) Field of Classification Search
CPC ... G01J 1/42; H01L 27/14681; H01L 31/1105

USPC ........................................................ 250/214.1
See application file for complete search history.

(56) References Cited

U.S. PATENT DOCUMENTS

| 5,705,846 A * | 1/1998 | Merrill ............. H01L 27/14679 |
| | | 257/291 |
| 7,745,816 B2 | 6/2010 | Mohseni |
| 9,054,247 B2 | 6/2015 | Mohseni et al. |
| 2015/0287870 A1 | 10/2015 | Mohseni et al. |

OTHER PUBLICATIONS

O.G. Memis, A. Katsnelson, S. C. Kong, H. Mohseni, M. Yan, S. Zhang, T. Hossain, N. Jin, and I. Adesida, "A Photon Detector with Very High Gain at Low Bias and at Room Temperature", Applied Physics Letters, 91, 171112, (2007).

(Continued)

*Primary Examiner* — Que T Le
(74) *Attorney, Agent, or Firm* — Pillsbury Winthrop Shaw Pittman, LLP

(57) ABSTRACT

Disclosed herein is a phototransistor (PT) comprising an emitter, a collector and a floating base; wherein the floating base, a p-n junction between the emitter and base (E-B junction) and a p-n junction between the base and the collector (B-C junction) are collectively in direct physical contact only with and completely encapsulated only by the emitter, the collector, and a section of a dielectric. Under an operating condition of the PT, a DC current density averaged over the E-B junction or a DC current density averaged over the B-C junction may be at least 100 times of a DC current density averaged over an opto-electronically active region of the PT. A sum of a capacitance of the E-B junction and a capacitance of the B-C junction may be less than 1 fF.

21 Claims, 6 Drawing Sheets

(56) References Cited

OTHER PUBLICATIONS

O.G. Memis, A. Katsnelson, S. C. Kong, H. Mohseni, M. Yan, S. Zhang, T. Hossain, N. Jin, and I. Adesida, "Sub-Poissonian Shot Noise of a High Internal Gain Injection Photon Detector", Optics Express, 16(17), 12701-12706, (2008).

Yashar Movassaghi, Vala Fathipour, Morteza Fathipour, Hooman Mohseni, "Analytical modeling and numerical simulation of the short-wave infrared electron-injection detectors", Applied Physics Letters, 108, 121102 (2016).

Mohsen Rezaei, Min-Su Park, Skylar Wheaton, Chee Leong Tan, Vala Fathipour, Olivier Guyon, Melville P. Ulmer, Hooman Mohseni, "New progress in electron-injection detectors for NIR imagers with low noise and high frame rates", Proc. SPIE 9915, High Energy, Optical, and Infrared Detectors for Astronomy VII, 99150P (Aug. 5, 2016); doi:10.1117/12.2233657; http://dx.doi.org/10.1117/12.2233657.

Vala Fathipour, Iman Hassani Nia, Alireza Bonakdar, Hooman Mohseni, "On the Sensitivity of Electron-Injection Detectors at Low Light Level", IEEE Photonics, 8, 3, 6803207, (2016).

Vala Fathipour, Alireza Bonakdar, Hooman Mohseni, "Advances on Sensitive Electron-Injection Based Cameras for Low-Flux, Short-Wave Infrared Applications", Frontiers in Materials, 3, 1-16, (2016).

V. Fathipour, H. Mohseni, "Electron-injection Detectors for Swept Source Optical Coherence Tomography", CLEO 2015: Applications and Technology, AM2J.3, OSA 2015.

V. Fathipour, H. Mohseni, "Enhancement of electron-injection detector performance by their unique three-dimensional geometry", Proc. SPIE 9609, Infrared Sensors, Devices, and Applications V, 960909 (Aug. 28, 2015); doi:10.1117/12.2187270; http://dx.doi.org/10.1117/12.2187270.

V. Fathipour, S.J. Jang, I. Hassaninia, H. Mohseni, "Approaching high temperature photon counting with electron-injection detectors", Proc. SPIE 9220, Infrared Sensors, Devices, and Applications IV, 92200J (Oct. 7, 2014); doi:10.1117/12.2060482; http://dx.doi.org/10.1117/12.2060482.

V. Fathipour, O.G. Memis, S.J. Jang, R.L. Brown, I. Hassani Nia, and H. Mohseni, "Isolated Electron Injection Detectors with High Gain and Record Low Dark Current at Telecom Wavelength", IEEE Journal of Selected Topics in Quantum Electronics, 20, (6), 3805106, (2014).

O.G. Memis, W. Wu, D. Dey, A. Katsnelson, H. Mohseni, "A type-II near-infrared detector with very high stable gain and low noise at room temperature", Semiconductor Device Research Symposium, 2007 International, pp. 1-2, 2007.

S. M. Sze and Kwok K. Ng, "Physics of Semiconductor Devices", 3rd edition, Wiley Interscience, John Wiley & Sons, Inc., 2007, ISBN-13: 978-0-471-14323-9, ISBN-10: 0-471-14323-5. Chapter 13 " Photodetectors and Solar Cells", Section 13.5 "Phototransistors", pp. 694-697.

John Kohoutek, Ivy Yoke Leng Wan, Omer Gokalp Memis, Hooman Mohseni, "An opto-electro-mechanical infrared photon detector with high internal gain at room temperature," Optics Express, 17 (17), (2009).

Omer Gokalp Memis, John Kohoutek, Wei Wu, Ryan M. Gelfand, and Hooman Mohseni, "Signal-to-noise performance of a short-wave infrared nanoinjection imager," Optical Letters 35 (16), (2010).

* cited by examiner

PHOTOTRANSISTOR HAVING E-B JUNCTION AND B-C JUNCTION ARE IN DIRECT PHYSICAL CONTACT AND COMPLETELY ENCAPSULATED ONLY BY THE EMITTER, THE COLLECTOR AND A DIELECTRIC

STATEMENT REGARDING FEDERALLY SPONSORED RESEARCH OR DEVELOPMENT

This invention was made with Government support under SBIR contracts FA8650-13-C-6378, M67854-14-C-6530, N00253-15-P-0315 awarded by the U.S. Department of Defense. The Government has certain rights in the invention.

BACKGROUND

With its high sensitivity, low amplification noise, high speed and high gain stability and uniformity from device to device, the phototransistor (PT) is a promising candidate for low light level sensing applications.

Phototransistors may be integrated into an image sensor, which is a device that converts an optical image into an electronic signal. It is used mostly in digital cameras, camera modules and other imaging devices.

SUMMARY

Disclosed herein is a phototransistor (PT) comprising an emitter, a collector and a floating base; wherein the floating base, a p-n junction between the emitter and base (E-B junction) and a p-n junction between the base and the collector (B-C junction) are collectively in direct physical contact only with and completely encapsulated only by the emitter, the collector, and a section of a dielectric.

According to an embodiment, the dielectric comprises dry thermal oxide, high-k dielectric, or a combination thereof.

According to an embodiment, the section of the dielectric is planar.

According to an embodiment, neither of the E-B junction and the C-B junction comprises a type-II hetero-structure.

According to an embodiment, under an operating condition of the PT, a direct-current (DC) current density averaged over the E-B junction is at least 100 times of a DC current density averaged over an opto-electronically active region of the PT, or a DC current density averaged over the B-C junction is at least 100 times of the DC current density averaged over the opto-electronically active region of the PT.

According to an embodiment, the DC current density averaged over the E-B junction or the DC current density averaged over the B-C junction is at least 1000 times of the DC current density averaged over the opto-electronically active region of the PT.

According to an embodiment, under an operating condition of the PT, a sum of a capacitance of the E-B junction and a capacitance of the B-C junction is less than 1 fF.

According to an embodiment, the sum is less than 0.1 fF.

According to an embodiment, under an operating condition of the PT, a depletion width of the E-B junction or a depletion width of the B-C junction exceeds 300 nm.

According to an embodiment, the depletion width of the E-B junction or the depletion width of the B-C junction exceeds 1000 nm.

According to an embodiment, under an operating condition of the PT, an area of the E-B junction or an area of the B-C junction is less than $\frac{1}{100}$ of an area of an opto-electronically active region of the PT.

According to an embodiment, the area of the E-B junction or the area of the B-C junction is less than $\frac{1}{1000}$ of the area of the opto-electronically active region of the PT.

According to an embodiment, under an operating condition of the PT, an area of the E-B junction or an area of the B-C junction is less than 1 $\mu m^2$.

According to an embodiment, the area of the E-B junction or the area of the B-C junction is less than 100000 $nm^2$.

According to an embodiment, under an operating condition of the PT, a linear dimension of the E-B junction or a linear dimension of the B-C junction is less than $\frac{1}{10}$ of a maximum linear dimension of an opto-electronically active region of the PT.

According to an embodiment, the linear dimension of the E-B junction or the linear dimension of the B-C junction is less than $\frac{1}{100}$ of the maximum linear dimension of the opto-electronically active region of the PT.

According to an embodiment, under an operating condition of the PT, a linear dimension of the E-B junction or a linear dimension of the B-C junction is less than 1 $\mu m$.

According to an embodiment, the linear dimension of the E-B junction or the linear dimension of the B-C junction is less than 300 nm.

According to an embodiment, with at least half of an atomic composition in an opto-electronically active region of the PT being silicon, wherein the PT has a photo-response 3-dB bandwidth (f3 dB) greater than 10 Hz in a limit of diminishing optical illumination, or the PT has a transition frequency (fT) greater than 100 Hz in the limit of diminishing optical illumination, under an operating condition of the PT and at room temperature.

According to an embodiment, the fT is greater than 1000 Hz.

Also disclosed herein is an apparatus comprising the PT described herein and the apparatus is selected from a group consisting of a focal plane array (FPA), an optical receiver, a camera, an imager, a LIDAR (Light Detection and Ranging) and a combination thereof.

DETAILED DESCRIPTION

Figure 1:
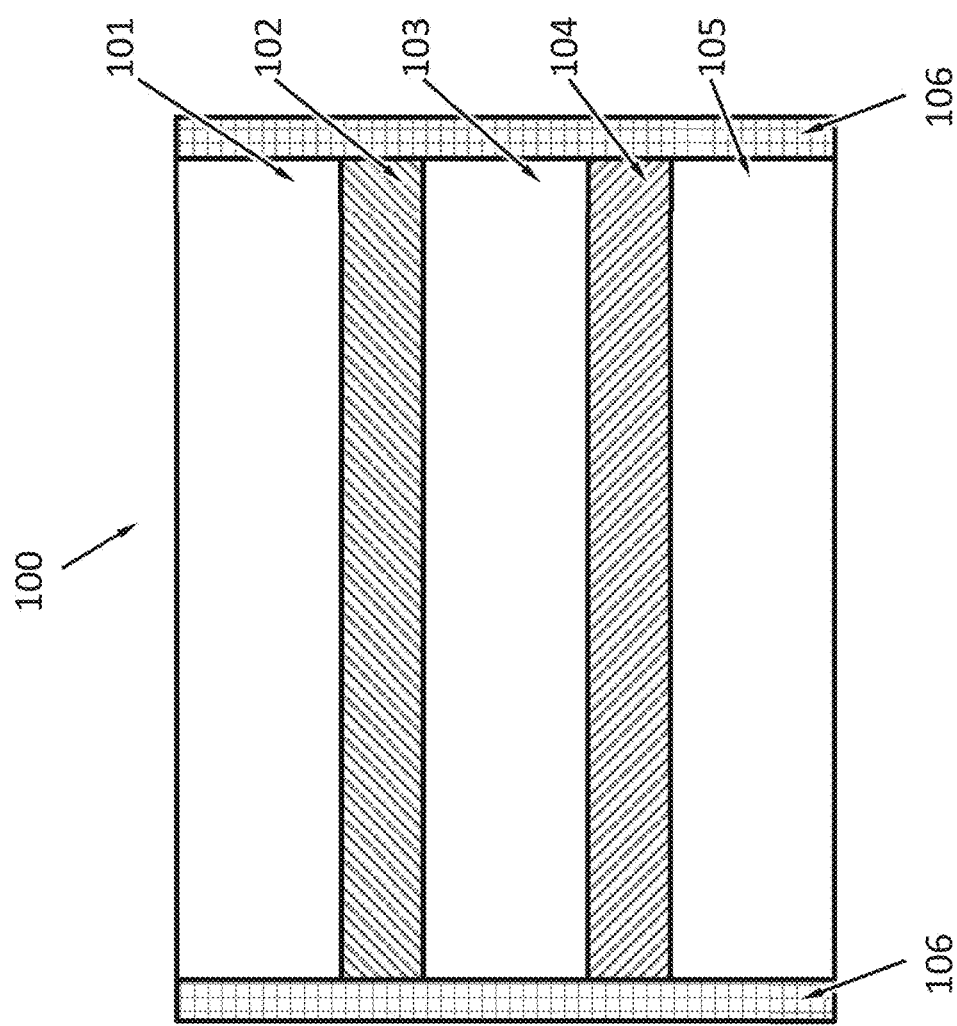
FIG. 1 schematically shows the cross-section view of a two-terminal floating-base bipolar PT.

U.S. Pat. Nos. 7,067,853, 8,253,215, 8,314,446, 8,354,324, 9,269,846, and U.S. Provisional Patent Application No. 62/266,935 are each hereby incorporated by reference in its entirety.

Although the term PT is used in this disclosure, the apparatuses and methods disclosed herein are applicable to both homo-junction phototransistors and hetero-junction phototransistors (HPT). Therefore, the term "PT" should be interpreted to encompass both homo-junction (e.g., silicon) phototransistors and hetero-junction (e.g., SiGe and SiGeC) phototransistors.

A PT may have three regions: the emitter (E), the base (B) and the collector (C). The emitter junction (ej), also called the emitter-base junction, or the E-B junction, is the p-n junction between the emitter and the base; and the collector junction (cj), also called the base-collector junction, or the B-C junction, is the p-n junction between the collector and the base. Here, a p-n junction refers to the p-n junction or its p-i-n junction variant between an n-type doped semiconductor and a p-type doped semiconductor. Therefore, the term "p-n junction" should be interpreted to encompass both the p-n junction and its p-i-n junction variant.

A "two-terminal" PT is a PT whose base floats electrically and is not in direct electrical contact with an electrode (e.g., polysilicon or metal). A "two-terminal" PT does not mean that the PT does not have a base. Rather it means a PT with an electrically floating base. In contrast, if the base of a PT is in direct electrical contact with an electrode, the base is not floating, and such a PT is referred to as a "three-terminal" PT.

According to an embodiment, in a two-terminal PT, the E-B junction, the base and the B-C junction are in direct physical contact only with and completely encapsulated only by the emitter, a dielectric, and the collector. The PT collector may optionally include a sub-collector.

The dielectric ("passivation dielectric") may comprise dry thermal oxide, high-k dielectric, or a combination thereof. The passivation dielectric may be formed by any suitable methods such as atomic layer deposition (ALD). The portion of the passivation dielectric that is in direct physical contact with the base, the E-B junction or the B-C junction may be planar.

The PT may be a bipolar PT. The bipolar PT may be either the npn type (n-doped emitter, p-doped base and n-doped collector), or the pnp type (p-doped emitter, n-doped base and p-doped collector). The base doping type is opposite to the emitter doping type and collector doping type. Type-II band alignment is not necessary in the PT disclosed herein.

The operating condition of a two-terminal floating-base bipolar PT is a condition where the E-B junction is forward biased and the B-C junction is reverse biased, the base floats electrically, and neither the E-B junction nor the B-C junction breaks down electrically. Here the electrical breakdown of a junction may include avalanche breakdown and Zener tunneling breakdown.

The opto-electronically active region of a PT is a region in which an optical spot in the limit of infinitely minimal size causes the direct-current (DC) responsivity of the PT to the optical spot under the operating condition to be greater than $1/e^2$ of the peak DC responsivity of the PT to an optical spot in the limit of infinitely minimal size under the same operating condition at the optical wavelength of maximum PT DC responsivity. Namely, the opto-electronically active region S is a region that satisfies the condition $r(x,y)|_{(x,y)\in S} \geq r_{max}/e^2$, where (x, y) is a location on the PT substrate; r(x, y) is the DC responsivity of the PT to the optical spot located at (x, y) in the limit of infinitely minimal size under the operating condition; and $r_{max}$ is the peak DC responsivity of the PT to an optical spot in the limit of infinitely minimal size under the same operating condition at the optical wavelength of maximum PT DC responsivity. Here, the optical spot in the limit of infinitely minimal size may be realized using near-field illumination through an optical aperture in the limit of infinitely minimal size at close proximity to the PT(s) under test and parallel to the PT substrate, and the scanning optical spot in the limit of infinitely minimal size may move in a plane parallel to the PT substrate, thus spatially scanning across the PT(s) under test in the two dimensions parallel to the PT substrate. The optical wavelength of maximum PT DC responsivity is mainly determined by the material of the PT and may be affected by the structure and the operating condition of the PT. Responsivity measures the electrical output per optical input of the PT. In the context of PT, responsivity may be approximately expressed as $R=I_{photo}/P_{photon}=\beta(e\lambda/hc)\eta$, when $\beta \gg 1$ and the quantum efficiency $\eta$ is approximately unity, where $P_{photon}$ is the power of the light incident on the PT, $\beta$ is the current amplification gain of the PT and $\lambda$ is the wavelength of the light incident on the PT. The DC responsivity is the responsivity under continuous-wave illumination at the slow-speed limit (i.e., in the steady-state).

The opto-electronically active region of one PT within a focal plane array (FPA) that comprises multiple PTs may comprise the emitter, E-B junction, base, B-C junction and collector, and may exclude a neighboring PT with or without spatial crosstalk.

The depletion width of a p-n junction in a PT may be parallel to the direction of current flow through the junction. The p-n junction area may be perpendicular to the direction of current flow through the junction.

When a first semiconductor with band gap Eg1 and a second semiconductor with band gap Eg2 are in direct physical contact, where Eg1>Eg2, a material hetero-structure is formed. If the band gap Eg2 lies completely within the band gap Eg1, i.e., if the conduction band minimum energy Ec2 of the second semiconductor is lower than or equal to the conduction band minimum energy Ec1. of the first semiconductor and the valance band maximum energy Ev2 of the second semiconductor is higher than or equal to the valance band maximum energy Ev1 of the first semiconductor (i.e., Ec1≥Ec2 and Ev1≤Ev2), the hetero-structure is defined as type-I. If the band gap Eg2 does not lie completely within the band gap Eg1, i.e., if Ec1<Ec2 or Ev1>Ev2, the hetero-structure is defined as type-II. For example, the hetero-structure formed by $Si_{(1-x)}Ge_x$ and Si has a basically flat conduction band alignment with conduction band offset smaller than 20 meV, and hence is a type-I hetero-structure for almost all practical device applications.

According to an embodiment, the E-B junction and the B-C junction do not contain any type-II hetero-structure.

The capacitance of the base Cb is approximately equal to the sum of the capacitance of the E-B junction Cej and the capacitance of the B-C junction Ccj.

In a PT with current crowding, if, under the operating condition, the DC current density averaged over the E-B junction is at least 100 (e.g., at least 1000, or 10000) times of the DC current density averaged over the opto-electronically active region of the PT, the PT with current crowding may be called an E-B junction current-crowded PT.

In a PT with current crowding, if, under the operating condition, the DC current density averaged over the B-C junction is at least 100 (e.g., at least 1000, or 10000) times of the DC current density averaged over the opto-electronically active region of the PT, the PC with current crowding may be called a B-C junction current-crowded PT.

In a PT with current crowding, if, under the operating condition, the DC current density averaged over the B-C junction is at least 100 (e.g., at least 1000, or 10000) times of the DC current density averaged over the opto-electronically active region of the PT, and the DC current density averaged over the E-B junction is at least 100 (e.g., at least 1000, or 10000) times of the DC current density averaged over the opto-electronically active region of the PT, the PC with current crowding may be called a B-C and E-B junction current-crowded PT.

A minimum-base-capacitance PT may be a PT that, under the operating condition, Cej, Ccj, and/or (Cej+Ccj) are less than 1 fF (e.g., less than 0.0001 fF, 0.001 fF, 0.01 fF or 0.1 fF).

A minimum-base-capacitance PT by maximum junction depletion width may be a minimum-base-capacitance PT that, under the operating condition, the depletion width of the E-B junction, and/or the depletion width of the B-C junction exceed 300 nm (e.g., exceed 1000 nm).

A minimum-base-capacitance PT by minimum junction area may be a minimum-base-capacitance PT that, under the operating condition, the area of the E-B junction and/or the area of the B-C junction are less than $\frac{1}{100}$ (e.g., less than $\frac{1}{10000}$ or $\frac{1}{1000}$) of the area of the opto-electronically active region of the PT.

A minimum-base-capacitance phototransistor (PT) by minimum junction area(s) may be a PT under the PT operating condition whose emitter junction (ej) area and/or collector junction (cj) area may be less than $\leq 1$ $\mu m^2$. Here, "$\leq 1$ $\mu m^2$" may be "$\leq 1000$ $nm^2$" or "$\leq 10000$ $nm^2$" or "$\leq 100000$ $nm^2$".

A minimum-base-capacitance PT by minimum junction size may be a minimum-base-capacitance PT that, under the operating condition, the linear dimension of the E-B junction and/or the linear dimension of the B-C junction are less than $\frac{1}{10}$ (e.g., less than $\frac{1}{100}$) of the maximum linear dimension of the opto-electronically active region of the PT.

A minimum-base-capacitance phototransistor (PT) by minimum junction size may be a minimum-base-capacitance PT that, under the operating condition, linear dimension of E-B junction and/or the linear dimension of B-C junction are less than 1 $\mu m$ (e.g., less than 30 nm, less than 100 nm, or less than 300 nm).

A PT where at least half of its atomic composition in its opto-electronically active region is silicon or silicon alloy (e.g., SiGe and SiGeC) may have a photo-response 3-dB bandwidth (f3 dB) greater than 10 Hz in the limit of diminishing (i.e., zero) optical illumination (i.e., under complete darkness except room-temperature thermal radiation), under the operating condition and at room temperature. Here, f3 dB is the frequency at which the alternating-current (AC) responsivity of the PT is $1/\sqrt{2}$ of its DC responsivity.

A PT where at least half of its atomic composition in its opto-electronically active region is silicon or silicon alloy (e.g., SiGe and SiGeC) may have a transition frequency (i.e., cutoff frequency, current-gain-bandwidth product) fT greater than 100 Hz (e.g., greater than 10000 Hz or greater than 1000) in the limit of diminishing (i.e., zero) optical illumination (i.e., under complete darkness except room-temperature thermal radiation), under the operating condition and at room temperature.

A focal plane array (FPA), optical receiver, camera, imager, LIDAR (Light Detection and Ranging) may comprise any of the PT above.

FIG. 1 schematically shows a two-terminal floating-base bipolar PT 100. The base 103, E-B junction 102 and B-C junction 104 collectively are in direct physical contact only with and completely encapsulated only by the emitter 101, collector 105 and a portion of a dielectric 106. Here, the phrase "collectively in direct physical contact only with" means that each of the group consisting of the base, the E-B junction and the B-C junction may be in direct physical contact with either of the other two members of the group or in direct physical contact with one or more of the emitter, the collector and the dielectric. For example, the E-B junction may be in direct physical contact with the emitter, the base and the dielectric, but nothing else; the base may be in direct physical contact with the E-B junction, the B-C junction and the dielectric but nothing else. Here, the phrase "completely encapsulated only by" means that the emitter, the collector and the dielectric form a complete enclosure that encompasses the base, the E-B junction and the B-C junction entirely inside.

Figure 2:
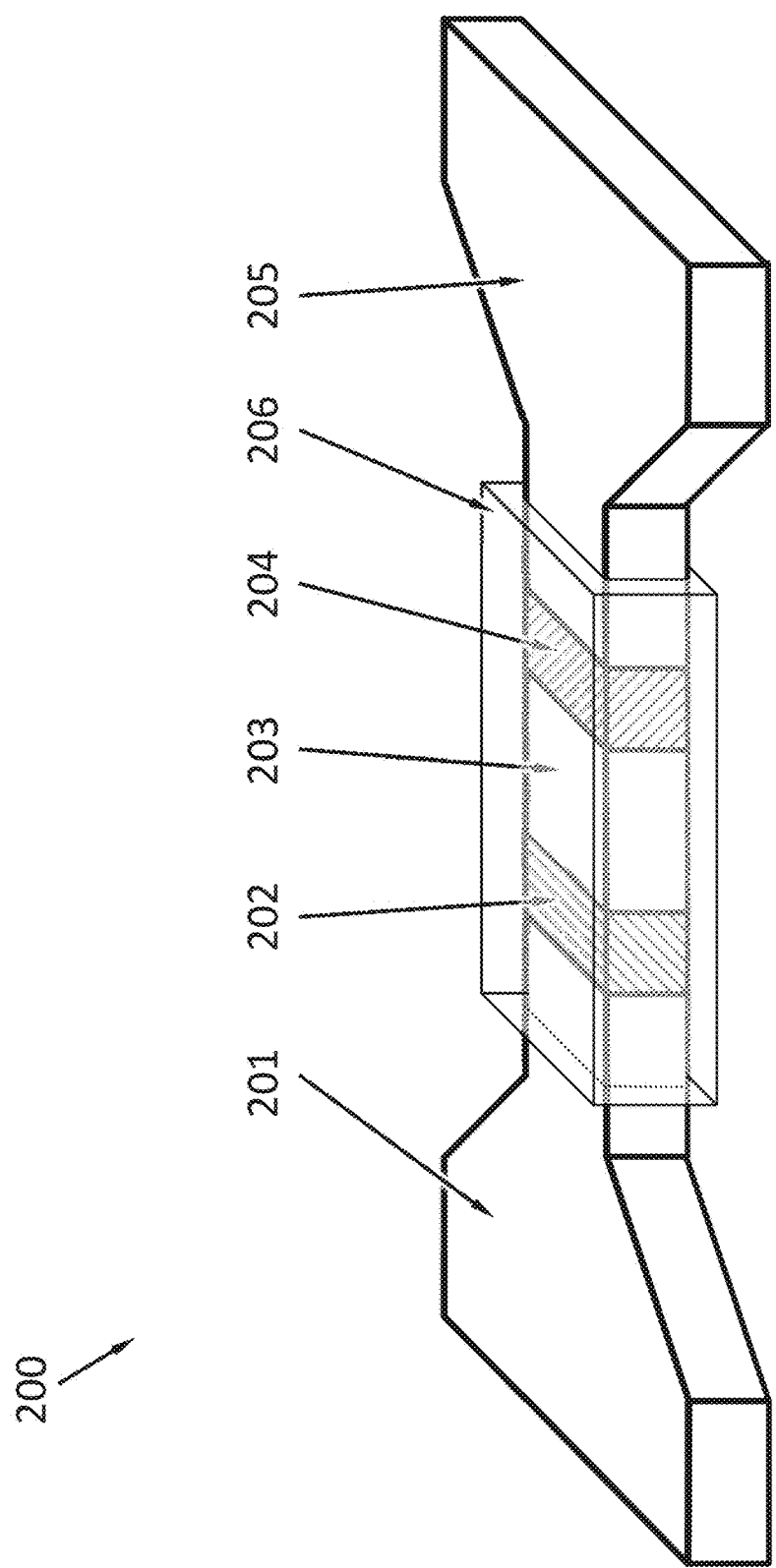
FIG. 2 schematically shows a two-terminal floating-base bipolar PT, according to an embodiment.

FIG. 2 schematically shows a two-terminal floating-base bipolar PT, according to an embodiment. The opto-electronically active region 200 of the PT comprises the emitter 201, E-B junction 202, base 203, C-B junction 204, collector 205, and a passivation dielectric 206 that electrically passivates the E-B junction 202, base 203 and C-B junction 204. The E-B junction 202, base 203 and the C-B junction 204 have smaller cross-sectional areas than the emitter 201 or the collector 205. For example, the cross-sectional areas of the E-B junction 202, base 203 and the C-B junction 204 are less than $\frac{1}{100}$, $\frac{1}{1000}$ or $\frac{1}{10000}$ of the cross-sectional areas of the emitter 201 or the collector 205.

Figure 3:
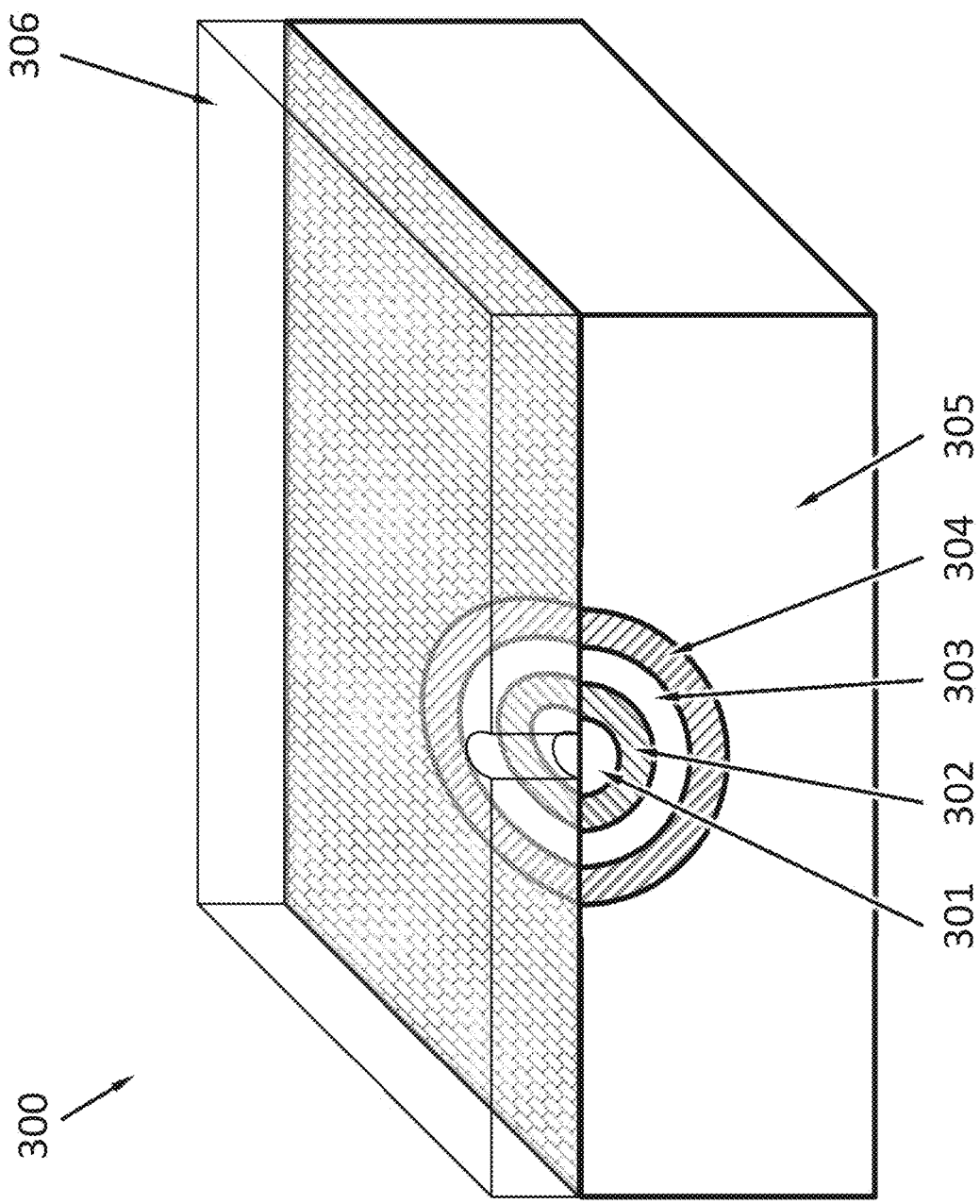
FIG. 3 schematically shows the cross-section view of a two-terminal floating-base bipolar phototransistor (PT), according to an embodiment.

FIG. 3 shows the cross-section view of a two-terminal floating-base bipolar PT, according to an embodiment. The opto-electronically active region 300 of the PT comprises the emitter 301, E-B junction 302, base 303, B-C junction 304, collector 305, and a passivation dielectric 306 that electrically passivates the E-B junction 302, base 303 and B-C junction 304. The emitter 301, E-B junction 302, base 303 and C-B junction 304 may be hemispherical. The emitter 301, E-B junction 302, base 303 and C-B junction 304 may be concentric.

Figure 4:
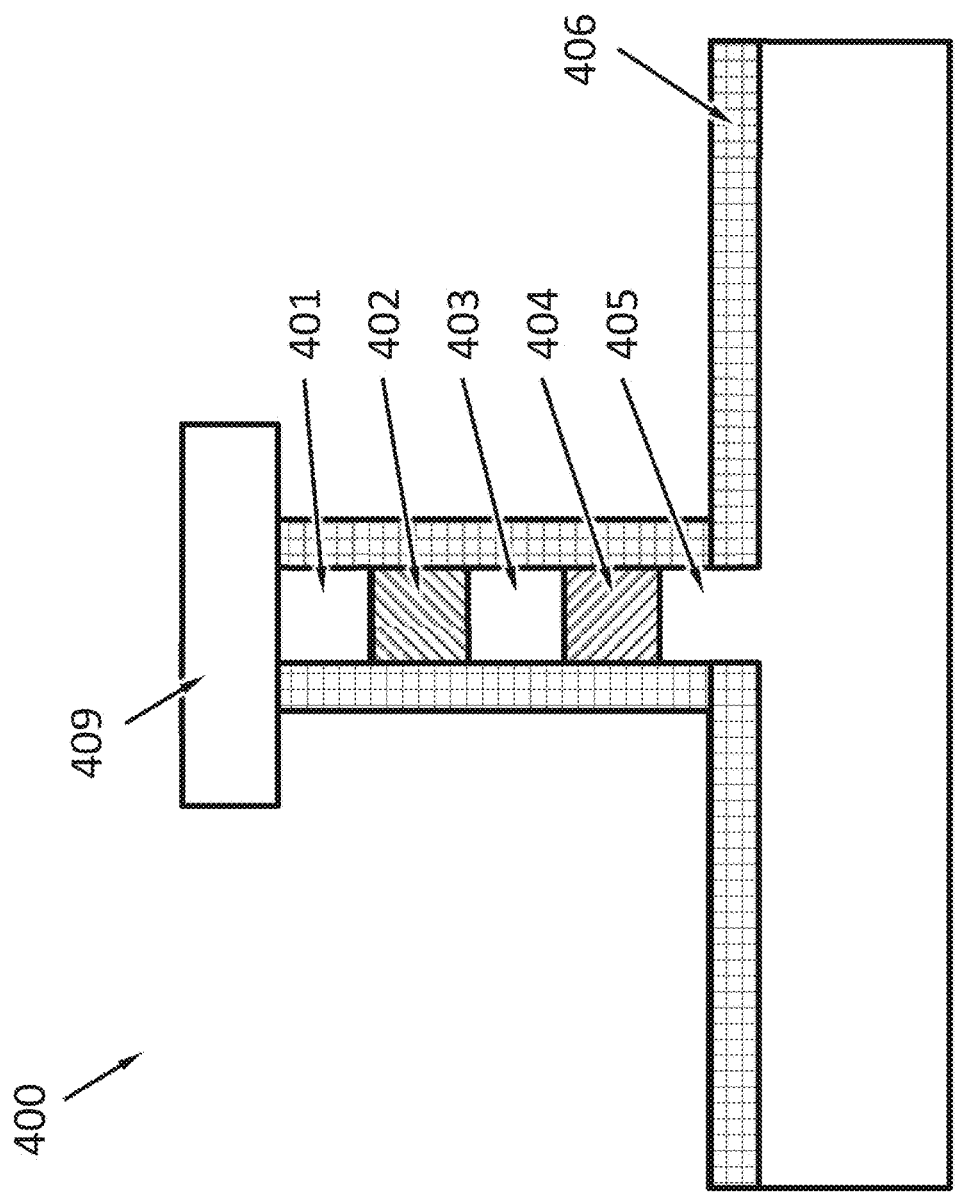
FIG. 4 schematically shows the cross-section view of a two-terminal floating-base bipolar phototransistor (PT), according to an embodiment.

FIG. 4 shows the cross-section view of a two-terminal floating-base bipolar PT, according to an embodiment. The opto-electronically active region 400 of the PT comprises the emitter 401, E-B junction 402, base 403, B-C junction 404, collector 405, a passivation dielectric 406, and an electrical contact 409. The emitter 401, E-B junction 402, base 403, C-B junction 404 and collector 405 are stacked in a direction perpendicular to a substrate on which the PT is disposed.

Figure 5A:
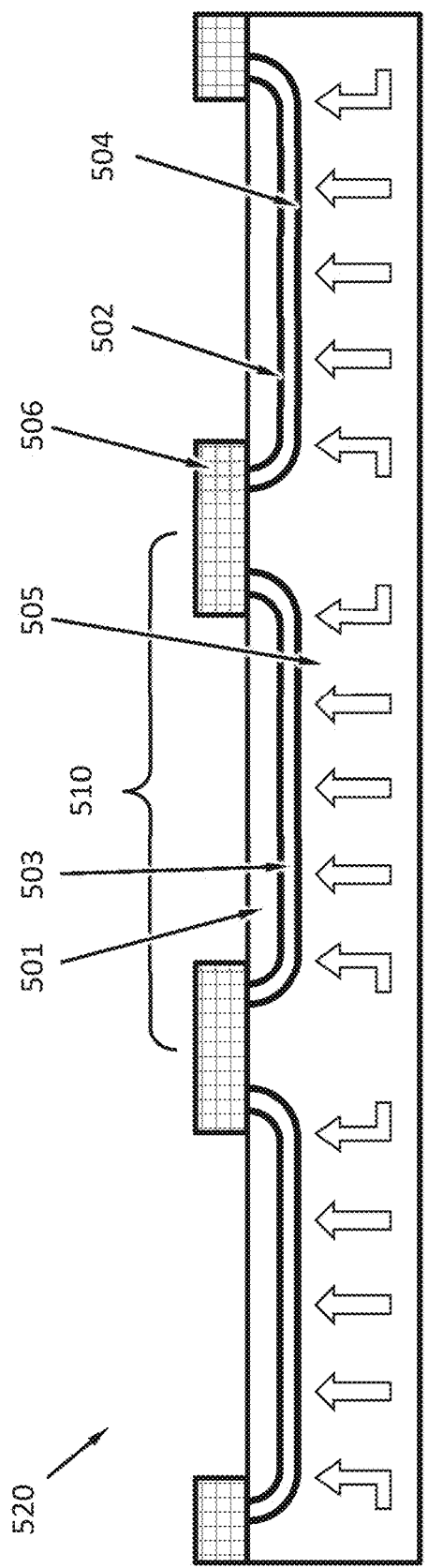
FIG. 5A schematically shows the cross-section view of a two-terminal floating-base planar bipolar PT within an FPA.
Figure 5B:
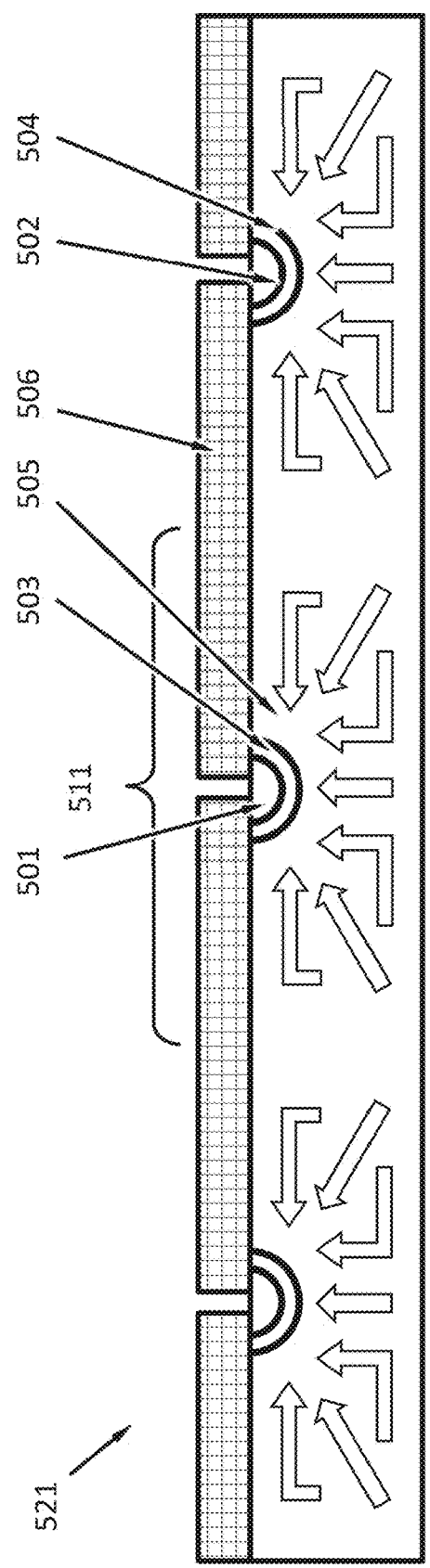
FIG. 5B schematically shows the cross-section view of a two-terminal floating-base planar bipolar PT within an FPA, according to an embodiment.

FIG. 5A and FIG. 5B each show a two-terminal floating-base planar bipolar PT whose base 503, E-B junction 502 and B-C junction 504 collectively are in direct physical contact only with and completely encapsulated only by the emitter 501, collector 505 and a planar section of a passivation dielectric 506. The arrows represent current flow under the operating condition. The direction of the current flow illustrated by the arrows is for an npn-PT under the operating condition. The direction of the current flow would be opposite in a pnp-PT under the operating condition. The PT in FIG. 5A has no current crowding and/or minimized base capacitance in its opto-electronically active region 510. The PT in FIG. 5A is part of a focal plane array (FPA) 520. FIG. 5B shows a two-terminal floating-base planar PT, according to an embodiment, that has current crowding and/or minimized base capacitance. The PT in FIG. 5B is part of a focal plane array (FPA) 521.

Under the operating condition, the DC current density averaged over the E-B junction may be at least 100 times of the DC current density averaged over the opto-electronically active region of the PT, and/or the DC current density averaged over the B-C junction may be at least 100 times of the DC current density averaged over the opto-electronically active region of the PT.

Under the operating condition, the sum of the E-B junction capacitance Cej and the B-C junction capacitance Ccj may be less than 1 fF, which may be realized with both E-B junction and B-C junction depletion widths greater than 300 nm, with both E-B junction and B-C junction areas less than 1/100 of the area of the opto-electronically active region of the PT, with both E-B junction and B-C junction areas less than ≤1 µm², with both the linear dimension of the E-B junction and the linear dimension of the B-C junction less than 1/10 of the maximum linear dimension of the opto-electronically active region of the PT, with both the linear dimension of the E-B junction and the linear dimension of the B-C junction less than ≤1 µm, or with a combination thereof.

In relation to the claims, it is intended that when words such as "a," "an," "at least one," or "at least one portion" are used to preface a feature there is no intention to limit the claim to only one such feature unless specifically stated to the contrary in the claim.

The descriptions above are intended to be illustrative, not limiting. Those of ordinary skill in the art may recognize that many modifications and variations of the above may be implemented without departing from the spirit or scope of the following claims. Thus, it is intended that the following claims cover the modifications and variations provided they come within the scope of the appended claims and their equivalents.

What is claimed is:

1. A phototransistor (PT) comprising an emitter, a collector and a floating base;
    wherein the floating base, a p-n junction between the emitter and base (E-B junction) and a p-n junction between the base and the collector (B-C junction) are collectively in direct physical contact only with and completely encapsulated only by the emitter, the collector, and a section of a dielectric.

2. The PT of claim 1, wherein the dielectric comprises dry thermal oxide, high-k dielectric, or a combination thereof.

3. The PT of claim 1, wherein the section of the dielectric is planar.

4. The PT of claim 1, wherein neither of the E-B junction and the C-B junction comprises a type-II hetero-structure.

5. The PT of claim 1, wherein, under an operating condition of the PT, a direct-current (DC) current density averaged over the E-B junction is at least 100 times of a DC current density averaged over an opto-electronically active region of the PT, or a DC current density averaged over the B-C junction is at least 100 times of the DC current density averaged over the opto-electronically active region of the PT.

6. The PT of claim 5, wherein the DC current density averaged over the E-B junction or the DC current density averaged over the B-C junction is at least 1000 times of the DC current density averaged over the opto-electronically active region of the PT.

7. The PT of claim 1, wherein, under an operating condition of the PT, a sum of a capacitance of the E-B junction and a capacitance of the B-C junction is less than 1 fF.

8. The PT of claim 7, wherein the sum is less than 0.1 fF.

9. The PT of claim 1, wherein, under an operating condition of the PT, a depletion width of the E-B junction or a depletion width of the B-C junction exceeds 300 nm.

10. The PT of claim 9, wherein the depletion width of the E-B junction or the depletion width of the B-C junction exceeds 1000 nm.

11. The PT of claim 1, wherein, under an operating condition of the PT, an area of the E-B junction or an area of the B-C junction is less than 1/100 of an area of an opto-electronically active region of the PT.

12. The PT of claim 11, wherein the area of the E-B junction or the area of the B-C junction is less than 1/1000 of the area of the opto-electronically active region of the PT.

13. The PT of claim 1, wherein, under an operating condition of the PT, an area of the E-B junction or an area of the B-C junction is less than 1 µm².

14. The PT of claim 13, wherein the area of the E-B junction or the area of the B-C junction is less than 100000 nm².

15. The PT of claim 1, wherein, under an operating condition of the PT, a linear dimension of the E-B junction or a linear dimension of the B-C junction is less than 1/10 of a maximum linear dimension of an opto-electronically active region of the PT.

16. The PT of claim 15, wherein the linear dimension of the E-B junction or the linear dimension of the B-C junction is less than 1/100 of the maximum linear dimension of the opto-electronically active region of the PT.

17. The PT of claim 1, wherein, under an operating condition of the PT, a linear dimension of the E-B junction or a linear dimension of the B-C junction is less than 1 µm.

18. The PT of claim 17, wherein the linear dimension of the E-B junction or the linear dimension of the B-C junction is less than 300 nm.

19. The PT of claim 1, with at least half of an atomic composition in an opto-electronically active region of the PT being silicon, wherein the PT has a photo-response 3-dB bandwidth (f3dB) greater than 10 Hz in a limit of diminishing optical illumination, or wherein the PT has a transition frequency (fT) greater than 100 Hz in the limit of diminishing optical illumination, under an operating condition of the PT and at room temperature.

20. The PT of claim 19, wherein the fT is greater than 1000 Hz.

21. An apparatus comprising a PT of claim 1, wherein the apparatus is selected from a group consisting of a focal plane array (FPA), an optical receiver, a camera, an imager, a LIDAR (Light Detection and Ranging) and a combination thereof.

* * * * *